(12) United States Patent
Lou et al.

(10) Patent No.: US 6,239,017 B1
(45) Date of Patent: May 29, 2001

(54) DUAL DAMASCENE CMP PROCESS WITH BPSG REFLOWED CONTACT HOLE

(75) Inventors: Chine-Gie Lou, Hsin Chu; Hsueh-Chung Chen, Taipei, both of (TW)

(73) Assignee: Industrial Technology Research Institute, Hsin-chu (TW)

( * ) Notice: Subject to any disclaimer, the term of this patent is extended or adjusted under 35 U.S.C. 154(b) by 0 days.

(21) Appl. No.: 09/156,357

(22) Filed: Sep. 18, 1998

(51) Int. Cl.[7] ............... H01L 21/4763; H01L 21/31; H01L 21/469
(52) U.S. Cl. ............... 438/624; 438/622; 438/760; 438/763
(58) Field of Search .................. 438/622, 624, 438/640, 763; 257/774

(56) References Cited

U.S. PATENT DOCUMENTS

| | | | |
|---|---|---|---|
| 4,349,584 | 9/1982 | Flatley et al. | 427/85 |
| 5,286,677 * | 2/1994 | Wu | 437/195 |
| 5,424,247 | 6/1995 | Sato | 437/195 |
| 5,595,937 | 1/1997 | Mikagi | 437/192 |
| 5,614,765 | 3/1997 | Avanzino et al. | 257/774 |
| 5,635,423 | 6/1997 | Huang et al. | 437/195 |

* cited by examiner

Primary Examiner—Charles Bowers
Assistant Examiner—Nema Berezny
(74) Attorney, Agent, or Firm—George O. Saile; Stephen B. Ackerman (57) ABSTRACT

An improved and new process for fabricating a planarized dual damascene contact hole and trench structure, wherein the contact holes have tapered sidewalls, has been developed. The dual damascene contact hole and trench are formed in a three layer insulator structure, in which the middle layer is a doped silicon oxide having a lower reflow temperature than the undoped silicon oxide layers forming the top and bottom layers. The contact holes are etched through the doped silicon oxide layer and the bottom undoped silicon oxide layer. The trenches are etched through the top undoped silicon oxide layer. After etching tapered sidewalls are formed at the contact holes by reflow of the doped silicon oxide through which the holes are etched.

20 Claims, 5 Drawing Sheets

DUAL DAMASCENE CMP PROCESS WITH BPSG REFLOWED CONTACT HOLE

BACKGROUND OF THE INVENTION (1) Field of the Invention

This invention relates to a method of fabrication used for semiconductor integrated circuit devices, and more specifically to the formation of conductive wiring and conductive vias on a semiconductor substrate, and to a dual damascene CMP (Chemical Mechanical Polishing) process for forming a planarized conductive interconnection structure.

(2) Description of the Related Art

Due to shrinkage in size of semiconductor components and increased circuit density the need arises to obtain contacts having surfaces of very small area and spaced at very small intervals. Furthermore, the complexity of interconnecting the many components in the dense circuits requires multiple layers of interconnecting conductor lines. As contact size has diminished to 0.5 micron or less, traditional methods for forming interconnection structures are not successful. One such traditional method involves deposition of a conductive layer onto an insulation layer, followed by lithography and subtractive etching of the conductive layer to form an interconnection pattern. After deposition of another insulation layer, via holes are formed at selected sites and filled with conductive material to make contact to the interconnection pattern. Then the above process is repeated to form multiple interconnection levels.

Recently damascene processes have been used as a replacement for the traditional deposition and subtractive etch processes. Damascene basically involves the formation of a trench which is filled in with a metal. Damascene differs from the traditional deposition and subtractive etch processes of providing an interconnection pattern, by providing a trench which is filled in with metal followed by planarization, whereas the traditional deposition and subtractive etch process involves forming a metal wiring interconnection pattern and then filling in the interwiring spaces with a dielectric material.

In a single damascene process the conductive plugs and each interconnection wiring pattern level are formed independently. Thus to form multiple wiring levels numerous processing steps are required. Furthermore, undesirable interfaces exist between each conductive plug and each interconnection wiring pattern.

Figure 1A:
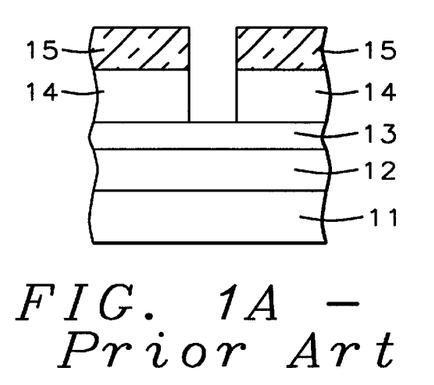
FIGS. 1A–1C, which in cross-sectional representation illustrat a conventional dual damascene process sequence.
Figure 1B:
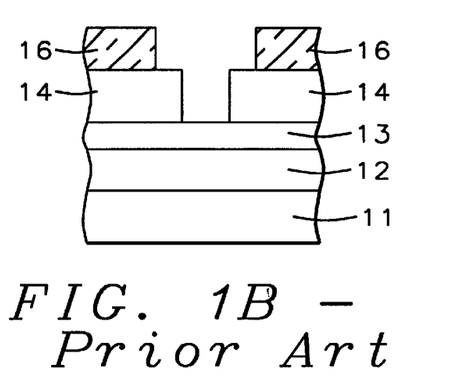
Figure 1C:
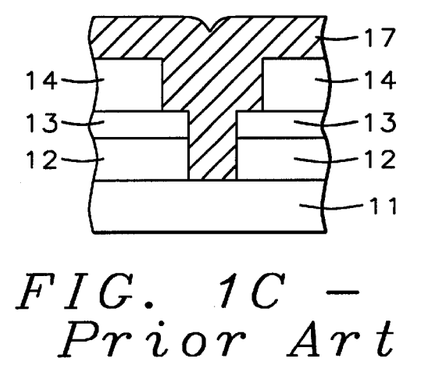

An improvement to the single damascene process is the dual damascene process, illustrated in FIGS. 1A to 1C. In the dual damascene process a first insulative layer 12 is deposited on a semiconductor substrate 11, and an etch stop layer 13 is deposited on the first insulative layer 12. Then a second insulative layer 14 is deposited on the etch stop layer 13. Typically, the first insulative layer 12 and the second insulative layer 14 are silicon oxide and the etch stop layer 13 is silicon nitride. As shown in FIG. 1A, a first photoresist mask 15 is formed on the second insulative layer and then a first opening is formed in the second insulative layer 14, but not penetrating etch stop layer 13. RIE (Reactive Ion Etching) is used to form the first opening in the second insulative layer and results in vertical side walls for the opening. As shown in FIG. 1B, after removing the first photoresist mask 15, a second photoresist mask 16 is formed on the second insulative layer 14. Then a trench is etched into the second insulative layer 14, while simultaneously extending the first opening through the etch stop layer 13 and the first insulative layer 12. Again RIE is used to etch the trench and extend the first opening, resulting in vertical sidewalls for the trench and the opening. As shown in FIG. 1C, after removal of the second photoresist mask 16, a conductive layer 17 is deposited to simultaneously fill the via and trench with conductive material.

As contact size becomes smaller, practice of the conventional dual damascene process illustrated in FIGS. 1A to 1C, results in imperfections in filling the opening and trench with conductive material. The principle problem is the inability to completely fill features that have high aspect ratios. Aspect ratio is defined as the ratio of the depth of the feature to the width of the feature. When the aspect ratio for a feature becomes larger than about 2, filling is incomplete and voids are formed within the conductive material. Such voids result in yield loss for the fabrication process or degraded current carrying capacity for the conductor.

Therefore, an important challenge in the dual damascene process is to achieve a trench and contact cross-sectional profile that is more easily filled with deposited conductive material while maintaining small contact size and without adding costly processing steps.

U.S. Pat. No. 4,349,584 entitled "Process For Tapering Openings In Ternary Glass Coatings" granted Sep. 14, 1982 to Doris W. Flatley et al describes a process for tapering openings in glass coatings formed from a layer of dense, undoped silicon oxide and a layer of ternary doped silicon oxide. After the contact openings are formed, both oxide layers are heated to a temperature below the flow temperature of the doped layer for a period of time sufficient to only soften and partially reflow the doped layer.

U.S. Pat. No. 5,595,937 entitled "Method For Fabricating Semiconductor Device With Interconnections Buried In Trenches" granted Jan. 21, 1997 to Kaoru Mikagi shows a method of forming interconnections buried in trenches.

U.S. Pat. No. 5,614,765 entitled "Self Aligned Via Dual Damascene" granted Mar. 25, 1997 to Steven Avanzino et al describes a process for forming both the conductive lines and conductive vias with only a single pattern exposure step for the openings for both the lines and the vias, thereby eliminating the critical alignment of two masks.

U.S. Pat. No. 5,635,423 entitled "Simplified Dual Damascene Process For Multi-Level Metallization And Interconnection Structure" granted Jun. 3, 1997 to Richard J. Huang et al describes a process for forming conductive lines and conductive vias in a structure comprising a first insulation layer, an etch stop layer, and a second insulation layer.

U.S. Pat. No. 5,424,247 entitled "Method For Making Contact Holes In Semiconductor Devices" granted Jun. 13, 1995 to Natsuki Sato teaches a method for forming a tapered opening using a reflow process.

The present invention is directed to a novel method of formation of conductive wiring and conductive contact holes on a semiconductor substrate, and to a dual damascene CMP (Chemical Mechanical Polishing) process for forming a planarized conductive interconnection structure.

SUMMARY OF THE INVENTION

It is a general object of the present invention to provide an improved method of forming an integrated circuit in which dual damascene and CMP processes are used to form planarized conductive interconnection structures.

A more specific object of the present invention is to provide an improved method of forming planarized conductive wiring and conductive contact holes on a semiconductor substrate, in which an improved dual damascene process results in improved voidless conductive contact holes and conductive interconnection wiring.

Another object of the present invention is to provide an improved method of forming a dual damascene contact hole and trench structure, wherein the trenches have vertical sidewalls and the contact holes have tapered sidewalls, said tapered contact hole sidewalls being formed by reflow of the insulative material through which the holes are etched.

In accordance with the present invention, the above and other objectives are realized by using a method of fabricating conductive wiring and a contact hole on a semiconductor substrate comprising the steps of: forming a first insulation layer, comprising an undoped silicon oxide, on said semiconductor substrate; forming a second insulation layer, comprising a ternary doped silicon oxide, on said first insulation layer; forming a third insulation layer, comprising an undoped silicon oxide, on said second insulation layer; forming an opening in said third insulation layer at a first location where said contact hole is desired, said opening penetrating through said third insulation layer; forming a trench in said third insulation layer at a second location where said wiring is desired while simultaneously extending said opening through said second insulation layer and through said first insulation layer wherein said trench is wider than and entirely inclusive of said opening; heating the three insulation layers to a temperature below the flow temperature of the second insulation layer for a period of time sufficient to only soften and partially reflow said second insulation layer at the edges of the contact opening, thus forming a tapered contact opening in said second insulation layer; depositing a conductive material on said third insulation layer, in said trench, and in said opening so that said conductive material completely fills said trench and said opening; and removing by CMP said conductive material from the surface of said third insulation layer.

In a second embodiment of the present invention, the above and other objectives are realized by using a method of fabricating a MOSFET device on a semiconductor substrate, using dual damascene to form a conductive plug and an interconnection wiring pattern, said conductive plug providing electrical contact between an active device region in the semiconductor substrate and the interconnection wiring pattern, comprising the steps of: providing said active device element in said semiconductor substrate; depositing a first insulation layer, comprising an undoped silicon oxide, on said semiconductor substrate, that includes said active device element; depositing a second insulation layer, comprising a ternary doped silicon oxide, on said first insulation layer; depositing a third insulation layer, comprising an undoped silicon oxide, on said second insulation layer; forming an opening in said third insulation layer at a first location where said conductive plug is desired, said opening penetrating through said third insulation layer; forming a trench in said third insulation layer at a second location where said interconnection wiring pattern is desired while simultaneously extending said opening through said second insulation layer and through said first insulation layer wherein said trench is wider than and entirely inclusive of said opening; heating the three insulation layers to a temperature below the flow temperature of the second insulation layer for a period of time sufficient to only soften and partially reflow said second insulation layer at the edges of the contact opening, thus forming a tapered contact opening in said second insulation layer; depositing a conductive material on said third insulation layer, in said trench, and in said opening so that said conductive material completely fills said trench and said opening; and removing by CMP said conductive material from the surface of said third insulation layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method of formation of conductive wiring and conductive contact holes on a semiconductor substrate will now be described in detail. The new and improved process uses partial reflow of an insulation layer to form tapered contact holes and dual damascene CMP (Chemical Mechanical Polishing) to form a planarized conductive interconnection structure.

Figure 2A:
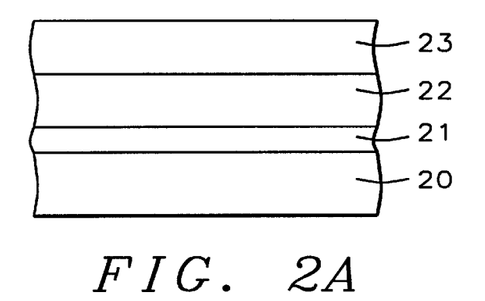
FIGS. 2A–2E, which in cross-sectional representation illustrate the method of one embodiment of the present invention.

Referring to FIG. 2A, a first insulation layer 21 is deposited onto semiconductor substrate 20. First insulation layer 21 is an undoped silicon glass, such as silicon oxide. First insulation layer 21 may be deposited by CVD (Chemical Vapor Deposition), LPCVD (Low Pressure Chemical Vapor Deposition), PECVD (Plasma Enhanced Chemical Vapor Deposition) or HDPCVD (High Density Plasma Chemical Vapor Deposition) processes. A preferred deposition process is PECVD using TEOS (tetraethylorthosilicate) as reaction gas. The first insulation layer 21, comprising undoped silicon oxide is deposited to a thickness between about 1000 and 5000 Angstroms, and the preferred thickness for first insulation layer 21 is 2000 Angstroms. A second insulation layer 22 is deposited onto first insulation layer 21. The second insulation layer 22 is a ternary doped silicon oxide, such as BPSG (borophosphosilicate glass), having a softening temperature less than the softening temperature of undoped silicon oxide. The BPSG second insulation layer 22 is deposited to a thickness between about 3000 and 10,000 Angstroms and the preferred thickness for BPSG second insulation layer 22 is 3000 Angstroms. The ternary doped silicon oxide comprising BPSG has a composition consisting of about 2 to 5 wt. % P and 2 to 5 wt. % B, resulting in a softening temperature for the BPSG between about 780 and 950° C. Since the softening temperature of the BPSG is between about 780 and 950° C., it is possible to cause partial reflow of BPSG at a temperature below the softening temperature of undoped silicon oxide. A third insulation layer 23 is deposited onto second insulation layer 22. The third insulation layer 23 comprises undoped silicon oxide, which may be deposited by CVD (Chemical Vapor Deposition), LPCVD (Low Pressure Chemical Vapor Deposition), PECVD (Plasma Enhanced Chemical Vapor Deposition) or HDPECVD (High Density Plasma Enhanced Chemical Vapor Deposition) processes. A preferred deposition process is PECVD using TEOS (tetraethylorthosilicate) as reaction gas. The third insulation layer 23, comprising undoped silicon oxide is deposited to a thickness between about 3000 and 5000 Angstroms, and the preferred thickness for third insulation layer 23 is 3000 Angstroms. The thicknesses of the first, second and third insulation layers are chosen so that etched contact holes will extend through the second and first insulation layers and a trench etched in the third insulation layer 23 will extend substantially through the third insulation layer 22 and the bottom of the trench will reside in the BPSG second insulation layer 22.

Figure 2B:
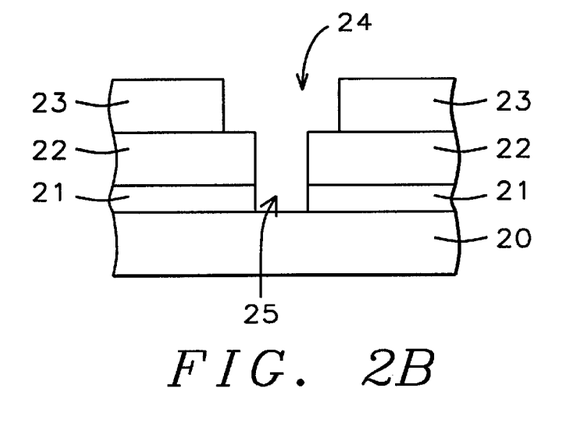

Next using lithographic masking steps and RIE, a trench 24 and a via hole 25 are etched, resulting in substantially vertical sidewalls for both the trench and the contact hole, as shown in FIG. 2B. The trench 24 is etched through third insulation layer 23 and the bottom of trench 24 resides in second insulation layer 22, which comprises BPSG. The contact hole 25 is etched through second insulation layer 22, comprising BPSG and through first insulation layer 21, comprising undoped silicon oxide.

Figure 2C:
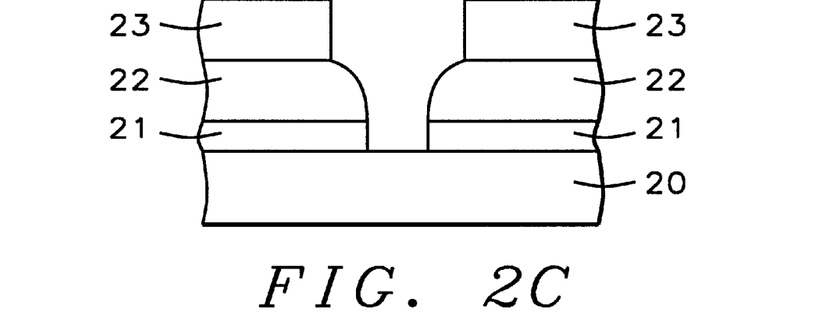
Figure 2D:
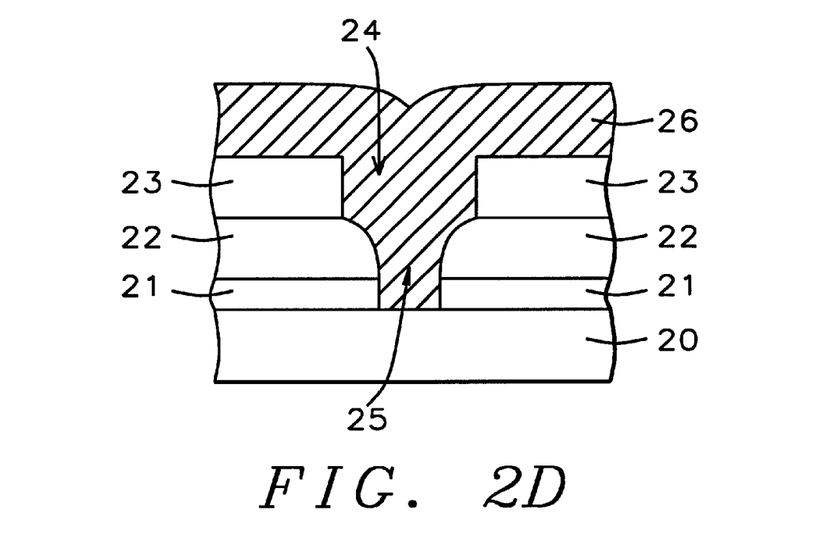
Figure 2E:
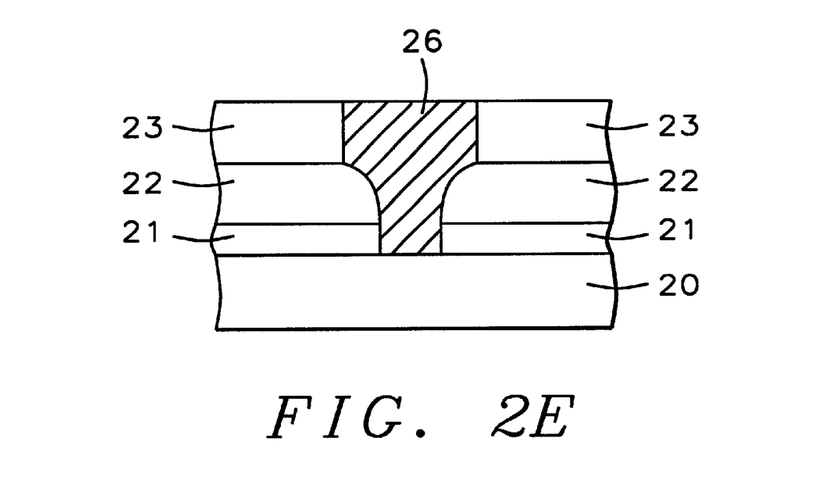

After removal of the lithographic mask the three insulation layers are heated to a temperature below the flow temperature of the second insulation layer for a period of time sufficient to only soften and partially reflow the second insulation layer 22 at the edges of the contact opening, thus forming a tapered contact opening in said second insulation layer 22, as shown in FIG. 2C. The preferred composition of the second insulation layer 22 is BPSG having a composition consisting of between about 2 and 5 wt. % P and between about 2 and 5 wt. % B, resulting in a softening temperature for the BPSG between about 780 and 950° C. The heating of the three insulation layers is at a temperature between about 780 and 950° C. for a time between about 15 and 25 min. The heating of the three insulation layers may be in a furnace containing an ambient of nitrogen or steam gas, at a temperature between about 780 and 950° C. for a time between about 15 and 45 min. Alternately, the heating of the three insulation layers may be by RTA (Rapid Thermal Anneal) at a temperature between about 800 and 1000° C. for a time between about 30 and 60 sec. After heating the three insulation layers to soften and partially reflow the second insulation layer 22, comprising BPSG, conductive material 26 is deposited into contact hole 25, into trench 24 and onto the third insulation layer 23, as shown in FIG. 2D. Due to the tapering of the contact hole in insulation layer 22 it is possible to voidlessly fill the contact hole and the trench with conductive material 26. The conductive material 26 comprises a metal selected from the group consisting of aluminum, tungsten, copper and alloys thereof. Alternately, the conductive material 26 comprises a metal selected from the group consisting of aluminum, tungsten, copper and alloys thereof and further includes an adhesion/barrier layer comprising Ti/TiN, Ta, TaN or WN. After deposition of the conductive material 26, CMP is used to remove the conductive material 26 from the top surface of third insulation layer 23, resulting in a planarized conductive interconnection structure as shown in FIG. 2E.

Figure 3A:
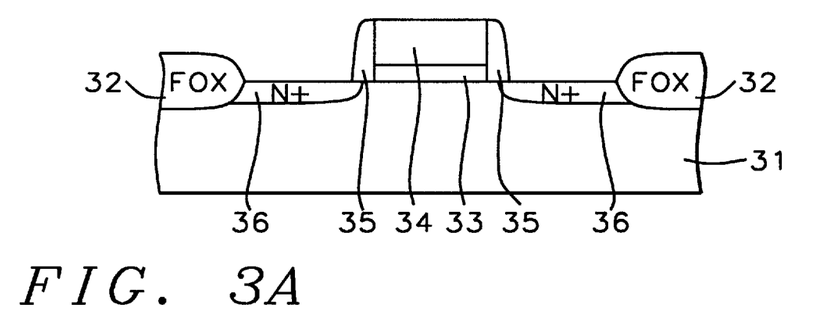
FIGS. 3A–3F, which in cross-sectional representation illustrate the method of a second embodiment of the present invention.

A second embodiment of the invention is illustrated in FIGS. 3A to 3F, which show the use of the invention to make contact to a MOSFET (Metal Oxide Semiconductor Field Effect Transistor) device, as currently being manufactured in industry. Only the specific areas unique to understanding this invention will be described in detail. FIG. 3A schematically illustrates in cross-sectional representation a metal oxide semiconductor field effect transistor, (MOSFET), device prior to the start of fabrication of the planarized conductive interconnection structure. A substrate 31 composed of P-type, single crystal silicon with a <100> orientation is used. A thick field oxide region 32, FOX, is formed surrounding the region where the device is to be built. Briefly, the method used to form the FOX region is to use a thin thermal oxide, and a silicon nitride layer, as an oxidation mask. The desired FOX insulator area is etched in the silicon nitride/silicon dioxide mask using conventional lithographic techniques and dry etching processes. After removal of the masking photoresist, and a wet chemical cleanup, a field oxide is grown, typically to a thickness between about 4000 and 6000 Angstroms. After removal of the oxidation mask using a hot phosphoric acid solution, followed by a buffered hydrofluoric acid dip process to remove the thin silicon dioxide layer, a gate oxide 33 is grown at a temperature between about 850 and 950° C., to a thickness between about 50 and 250 Angstroms. Next a polysilicon layer is deposited to a thickness between about 2000 and 4000 Angstroms. An ion implantation procedure, using phosphorus, is used to dope the underlying polysilicon layer. Standard lithographic procedures and RIE are used to create the polysilicon gate structure 34, as shown in FIG. 3A. Another LPCVD process, using tetraethylorthosilicate as a source material, is used to deposit silicon oxide to a thickness between about 2000 and 4000 Angstroms. Anisotropic, selective RIE is then used to create the oxide sidewall spacer 35. The source and drain regions 36 are next formed using ion implantation of arsenic.

Figure 3B:
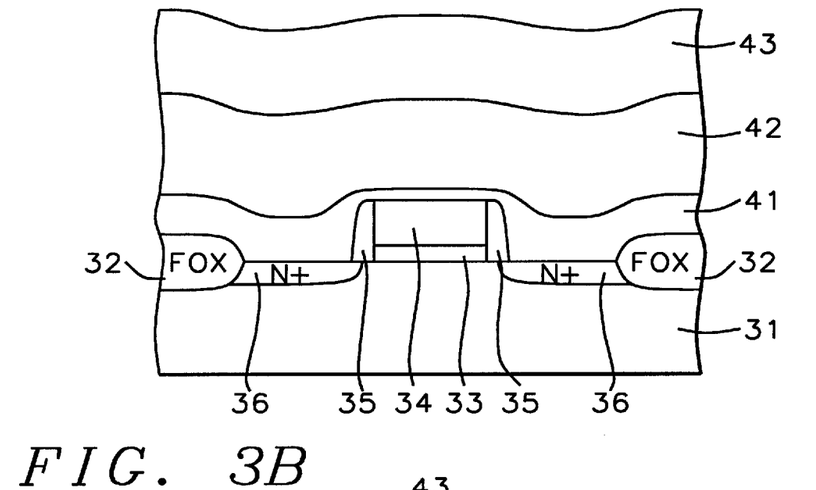

Referring to FIG. 3B, a first insulation layer 41 is deposited onto semiconductor substrate 31. First insulation layer 41 is an undoped silicon glass, such as silicon oxide. First insulation layer 41 may be deposited by CVD (Chemical Vapor Deposition), LPCVD (Low Pressure Chemical Vapor Deposition), PECVD (Plasma Enhanced Chemical Vapor Deposition) or HDPECVD (High Density Plasma Enhanced Chemical Vapor Deposition) processes. A preferred deposition process is PECVD using TEOS (tetraethylorthosilicate) as reaction gas. The first insulation layer 41, comprising undoped silicon oxide is deposited to a thickness between about 1000 and 5000 Angstroms, and the preferred thickness for first insulation layer 41 is 2000 Angstroms. A second insulation layer 42 is deposited onto first insulation layer 41. The second insulation layer 42 is a ternary doped silicon oxide, such as BPSG (borophosphosilicate glass), having a softening temperature less than the softening temperature of undoped silicon oxide. The BPSG second insulation layer 42 is deposited to a thickness between about 3000 and 10,000 Angstroms and the preferred thickness for BPSG second insulation layer 42 is 3000 Angstroms. The ternary doped silicon oxide comprising BPSG has a composition consisting of about 2 to 5 wt. % P and 2 to 5 wt. % B, resulting in a softening temperature for the BPSG between about 780 and 950° C. Since the softening temperature of the BPSG is between about 780 and 950° C., it is possible to cause partial reflow of BPSG at a temperature below the softening temperature of undoped silicon oxide. A third insulation layer 43 is deposited onto second insulation layer 42. The third insulation layer 43 comprises undoped silicon oxide, which may be deposited by CVD (Chemical Vapor Deposition), LPCVD (Low Pressure Chemical Vapor Deposition), PECVD (Plasma Enhanced Chemical Vapor Deposition) or HDPECVD (High Density Plasma Enhanced Chemical Vapor Deposition) processes. A preferred deposition process is PECVD using TEOS (tetraethylorthosilicate) as reaction gas. The third insulation layer 43, comprising undoped silicon oxide is deposited to a thickness between about 3000 and 5000 Angstroms, and the preferred thickness for third insulation layer 43 is 3000 Angstroms. The thicknesses of the first, second and third insulation layers are chosen so that etched contact holes will extend through the second and first insulation layers and a trench etched in the third insulation layer 43 will extend substantially through the third insulation layer 42 and the bottom of the trench will reside in the BPSG second insulation layer 42.

Figure 3C:
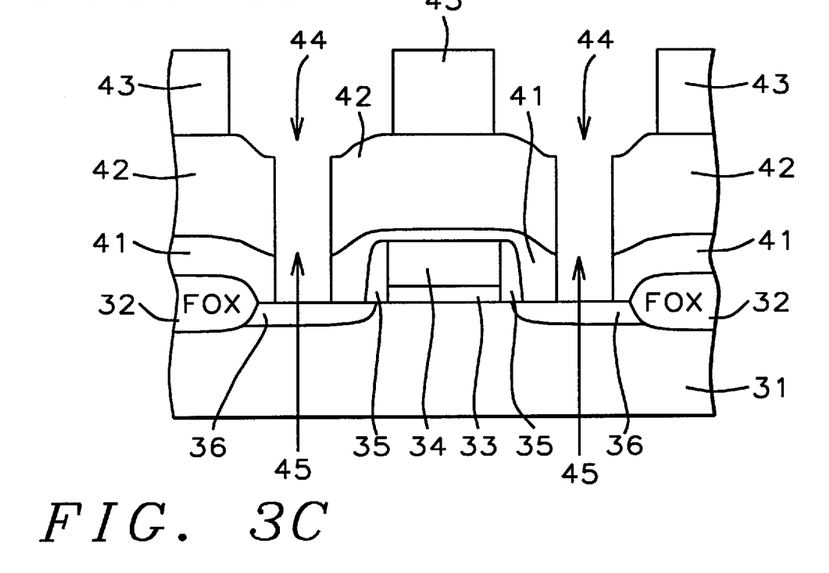

Next using lithographic masking steps and RIE, a trench 44 and a contact hole 45 are etched, resulting in substantially vertical sidewalls for both the trench and the contact hole, as shown in FIG. 3C. The trench 44 is etched through third insulation layer 43 and the bottom of trench 44 resides in second insulation layer 42, which comprises BPSG. The contact hole 45 is etched through second insulation layer 42, comprising BPSG and through first insulation layer 21, comprising undoped silicon oxide and exposes the source and drain contact regions.

Figure 3D:
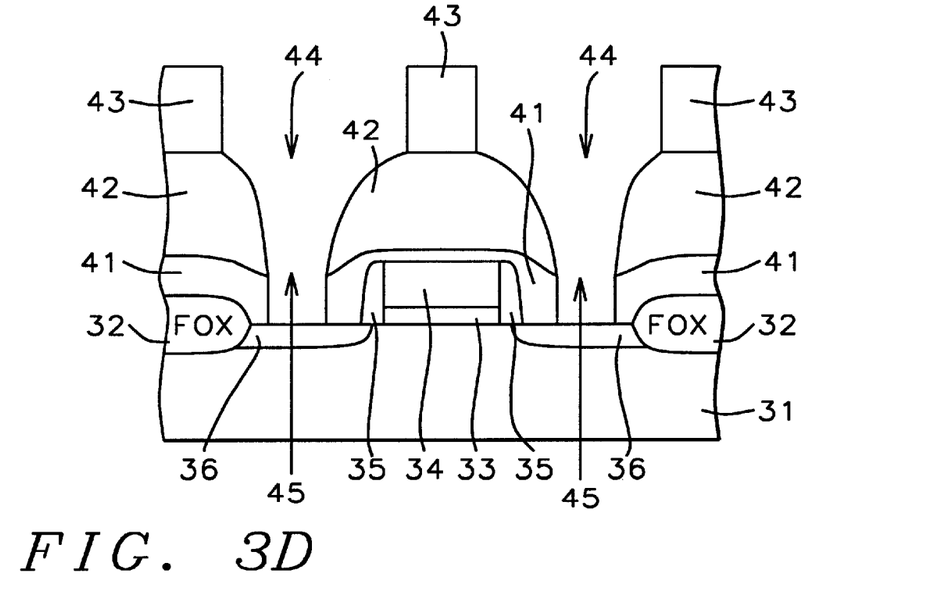
Figure 3E:
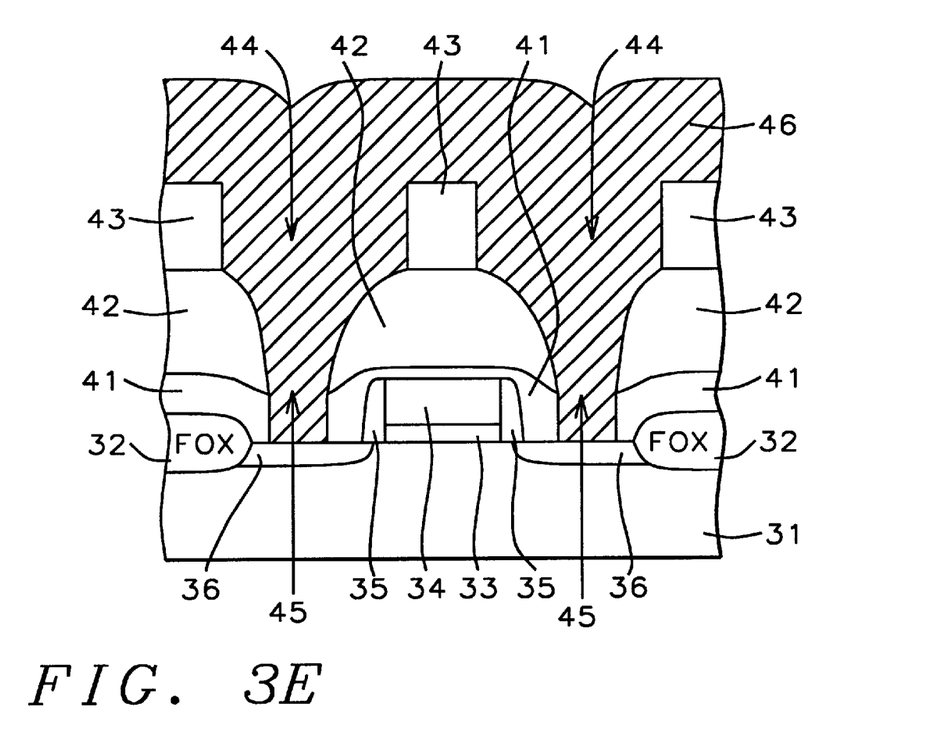
Figure 3F:
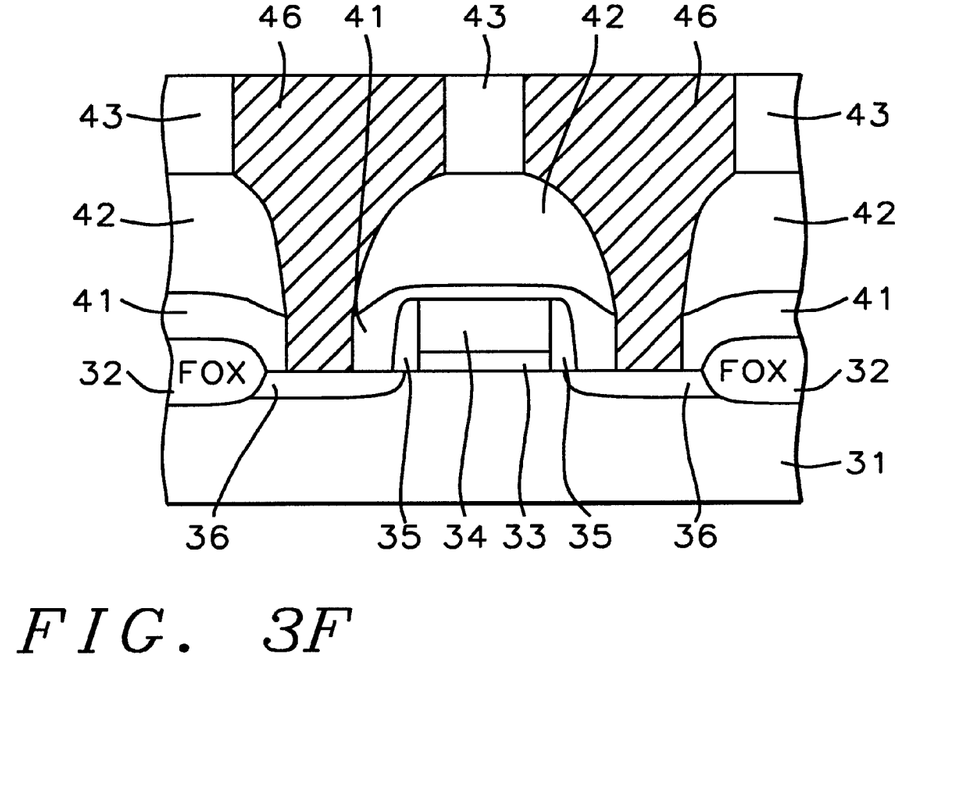

After removal of the lithographic mask the three insulation layers are heated to a temperature below the flow temperature of the second insulation layer for a period of time sufficient to only soften and partially reflow the second insulation layer 42 at the edges of the contact opening, thus forming a tapered contact opening in said second insulation layer 42, as shown in FIG. 3D. The preferred composition of the second insulation layer 42 is BPSG having a composition consisting of about 2 to 5 wt. % P and 2 to 5 wt. % B, resulting in a softening temperature for the BPSG between about 780 and 950° C. The heating of the three insulation layers is at a temperature between about 780 and 950° C. for a time between about 15 and 45 min. The heating of the three insulation layers may be in a furnace containing an ambient of nitrogen or steam gas, at a temperature between about 780 and 950° C. for a time between about 15 and 45 min. Alternately, the heating of the three insulation layers may be by RTA (Rapid Thermal Anneal) at a A temperature between about 800 and 1000° C. for a time between about 30 and 60 sec. After heating the three insulation layers to soften and partially reflow the second insulation layer 42, comprising BPSG, conductive material 46 is deposited into contact hole 45, into trench 44 and onto the third insulation layer 43, as shown in FIG. 3E. Due to the tapering of the contact hole in insulation layer 42 it is possible to voidlessly fill the contact hole and the trench with conductive material 46. The conductive material 46 comprises a metal selected from the group consisting of aluminum, tungsten, copper and alloys thereof. Alternately, the conductive material 46 comprises a metal selected from the group consisting of aluminum, tungsten, copper and alloys thereof and further includes an adhesion/barrier layer comprising Ti/TiN, Ta, TaN or WN. After deposition of the conductive material 46, CMP is used to remove the conductive material 46 from the top surface of third insulation layer 43, resulting in a planarized conductive interconnection structure as shown in FIG. 3F.

While the invention has been particularly shown and described with reference to the preferred embodiments thereof, it will be understood by those skilled in the art that various changes in form and details may be made without departing from the spirit and scope of the invention.

What is claimed is:

1. A method of fabricating conductive wiring and a contact hole on a semiconductor substrate comprising:

forming a first insulation layer, comprising an undoped silicon oxide, on said semiconductor substrate;

forming a second insulation layer, comprising a ternary doped silicon oxide, on said first insulation layer;

forming a third insulation layer, comprising an undoped silicon oxide, on said second insulation layer;

forming an opening in said third insulation layer at a first location where said contact hole is desired, said opening penetrating through said third insulation layer;

forming a trench in said third insulation layer at a second location where said wiring is desired while simultaneously extending said opening through said second insulation layer and through said first insulation layer wherein said trench is wider than and entirely inclusive of said opening;

heating the three insulation layers to a temperature below the flow temperature of the second insulation layer for a period of time sufficient to only soften and partially reflow said second insulation layer at the edges of the contact opening, thus forming a tapered contact opening in said second insulation layer;

depositing a conductive material on said third insulation layer, in said trench, and in said opening so that said conductive material completely fills said trench and said opening; and removing by CMP said conductive material from the surface of said third insulation layer.

2. The method of claim 1, wherein said first insulation layer is undoped silicon oxide deposited to a thickness between about 1000 and 5000 Angstroms by PECVD processes.

3. The method of claim 1, wherein said second insulation layer is ternary doped silicon oxide comprising BPSG deposited to a thickness between about 3000 and 10,000 Angstroms by PECVD processes.

4. The method of claim 1, wherein said third insulation layer is undoped silicon oxide deposited to a thickness between about 3000 and 5000 Angstroms by PECVD processes.

5. The method of claim 3, wherein said ternary doped silicon oxide comprising BPSG has a composition consisting of about 2 to 5 wt. % P and 2 to 5 wt. % B.

6. The method of claim 1, wherein said heating the three insulation layers is at a temperature between about 780 and 950° C. for a time between about 15 and 45 min.

7. The method of claim 1, wherein said heating the three insulation layers is in an ambient containing nitrogen or steam gas, at a temperature between about 780 and 950° C. for a time between about 15 and 45 min.

8. The method of claim 1, wherein said heating the three insulation layers is by RTA (Rapid Thermal Anneal) at a temperature between 800 and 1000° C. for a time between about 30 and 60 sec.

9. The method of claim 1, wherein said conductive material comprises a metal selected from the group consisting of aluminum, tungsten, copper and alloys thereof.

10. The method of claim 1, wherein said conductive material comprises a metal selected from the group consisting of aluminum, tungsten, copper and alloys thereof and further includes an adhesion/barrier layer comprising Ti/TiW, Ta, TaN or WN.

11. A method for fabricating a MOSFET device on a semiconductor substrate, using dual damascene to form a conductive plug and an interconnection wiring pattern, said conductive plug providing electrical contact between an active device region in the semiconductor substrate and the interconnection wiring pattern, comprising the steps of:

providing said active device element in said semiconductor substrate;

depositing a first insulation layer, comprising an undoped silicon oxide, on said semiconductor substrate, that includes said active device element;

depositing a second insulation layer, comprising a ternary doped silicon oxide, on said first insulation layer;

depositing a third insulation layer, comprising an undoped silicon oxide, on said second insulation layer;

forming an opening in said third insulation layer at a first location where said conductive plug is desired, said opening penetrating through said third insulation layer;

forming a trench in said third insulation layer at a second location where said interconnection wiring pattern is desired while simultaneously extending said opening through said second insulation layer and through said first insulation layer wherein said trench is wider than and entirely inclusive of said opening;

heating the three insulation layers to a temperature below the flow temperature of the second insulation layer for a period of time sufficient to only soften and partially reflow said second insulation layer at the edges of the contact opening, thus forming a tapered contact opening in said second insulation layer;

depositing a conductive material on said third insulation layer, in said trench, and in said opening so that said conductive material completely fills said trench and said opening; and removing by CMP said conductive material from the surface of said third insulation layer.

12. The method of claim 11, wherein said first insulation layer is undoped silicon oxide deposited to a thickness between about 1000 and 5000 Angstroms by PECVD processes.

13. The method of claim 11, wherein said second insulation layer is ternary doped silicon oxide comprising BPSG deposited to a thickness between about 3000 and 10,000 Angstroms by PECVD processes.

14. The method of claim 11, wherein said third insulation layer is undoped silicon oxide deposited to a thickness between about 3000 and 5000 Angstroms by PECVD processes.

15. The method of claim 13, wherein said ternary doped silicon oxide comprising BPSG has a composition consisting of about 2 to 5 wt. % P and 2 to 5 wt. % B.

16. The method of claim 11, wherein said heating the three insulation layers is at a temperature between about 780 and 950° C. for a time between about 15 and 45 min.

17. The method of claim 11, wherein said heating the three insulation layers is in an ambient containing nitrogen or steam gas, at a temperature between about 780 and 950° C. for a time between about 15 and 45 min.

18. The method of claim 11, wherein said heating the three insulation layers is by RTA (Rapid Thermal Anneal) at a temperature between 800 and 1000° C. for a time between about 30 and 60 sec.

19. The method of claim 11, wherein said conductive material comprises a metal selected from the group consisting of aluminum, tungsten, copper and alloys thereof.

20. The method of claim 11, wherein said conductive material comprises a metal selected from the group consisting of aluminum, tungsten, copper and alloys thereof and further includes an adhesion/barrier layer comprising Ti/TiW, Ta, TaN or WN.

* * * * *